(12) United States Patent
Zare-Hoseini et al.

(10) Patent No.: US 9,362,938 B2
(45) Date of Patent: Jun. 7, 2016

(54) ERROR MEASUREMENT AND CALIBRATION OF ANALOG TO DIGITAL CONVERTERS

(71) Applicant: QUALCOMM Technologies International, Ltd., Cambridge (GB)

(72) Inventors: Hashem Zare-Hoseini, Cambridge (GB); Dimitrios Mavridis, Cambridge (GB)

(73) Assignee: QUALCOMM Technologies International, Ltd., Cambridge (GB)

( * ) Notice: Subject to any disclaimer, the term of this patent is extended or adjusted under 35 U.S.C. 154(b) by 0 days.

(21) Appl. No.: 14/487,166

(22) Filed: Sep. 16, 2014

(65) Prior Publication Data
US 2016/0079995 A1 Mar. 17, 2016

(51) Int. Cl.
*H03M 1/38* (2006.01)
*H03M 1/10* (2006.01)
*H03M 1/46* (2006.01)
*H03M 1/40* (2006.01)

(52) U.S. Cl.
CPC .......... *H03M 1/1071* (2013.01); *H03M 1/1009* (2013.01); *H03M 1/38* (2013.01); *H03M 1/403* (2013.01); *H03M 1/466* (2013.01)

(58) Field of Classification Search
CPC . H03M 1/1071; H03M 1/466; H03M 1/1009; H03M 1/38; H03M 1/403
USPC .......................................... 341/120, 155, 163
See application file for complete search history.

(56) References Cited

U.S. PATENT DOCUMENTS

| | | | |
|---|---|---|---|
| 6,778,123 B1 | 8/2004 | Bock et al. | |
| 8,451,151 B2 * | 5/2013 | Lin | H03M 1/1061 341/110 |
| 8,519,874 B2 * | 8/2013 | Aruga | H03M 1/1019 341/120 |
| 8,659,461 B1 | 2/2014 | Zhu et al. | |
| 8,766,839 B2 * | 7/2014 | Janakiraman | H03M 1/0697 341/150 |
| 8,907,826 B2 * | 12/2014 | Hong | H03M 1/1071 341/118 |
| 2010/0079325 A1 | 4/2010 | Berens et al. | |
| 2010/0090873 A1 | 4/2010 | Yang | |
| 2012/0075128 A1 | 3/2012 | Aruga et al. | |
| 2012/0256774 A1 | 10/2012 | Dey et al. | |

* cited by examiner

*Primary Examiner* — Brian Young
(74) *Attorney, Agent, or Firm* — The Marbury Law Group, PLLC

(57) ABSTRACT

Methods of measuring capacitance error in a successive approximation register (SAR) analog to digital converter (ADC) are described, including a method in which said ADC includes a register and a digital to analog converter (DAC), and the method comprises connecting a first capacitance associated with a first bit of the DAC between a first reference voltage and a second reference voltage, connecting a first set of one or more capacitances associated with one or more other bits of the DAC between the first reference voltage and a third reference voltage, connecting the first capacitance between a first node and the third reference voltage, connecting the first set of one or more capacitances between the first node and the second reference voltage, and measuring a voltage at the first node to determine a representation of a difference between the first capacitance and a total capacitance of the first set of one or more capacitances.

17 Claims, 5 Drawing Sheets

US 9,362,938 B2

ERROR MEASUREMENT AND CALIBRATION OF ANALOG TO DIGITAL CONVERTERS

TECHNICAL FIELD

Embodiments described herein relate to analog to digital converters (ADCs), and in particular to successive approximation register (SAR) ADCs, such as capacitive ADCs, and methods of measuring errors in and/or calibrating such ADCs.

BACKGROUND

Successive approximation register (SAR) analog to digital converters (ADCs) are common in data acquisition systems in low power applications. Recent SAR ADCs have provided a sampling frequency (that is, the number of samples per second) in the megahertz region with, for example, a 12-bit resolution.

SAR ADCs can be suitable for low power applications as certain examples do not need active amplifiers and circuitries for their operations, and ideally need only a comparator to do a cycle of comparisons and a DAC that can be passive, e.g. capacitive or resistive.

A general block diagram of an example SAR ADC is shown in FIG. 1. The ADC 100 comprises a comparator 102, a digital to analog converter (DAC) 104 and successive approximation register and controller 106. The register and controller 106 receives a clock signal from clock generator 108. An analog input signal $V_{IN}$ 110 is provided to the negative input of the comparator 102, and the positive input receives a signal from the output of the DAC 104, which converts the digital register value to an analog signal.

Initially, the register value is set to zero and the analog input signal is sampled into the capacitive DAC. Then the sampled analog input is compared with different references that are generated by the capacitive DAC controlled by the successive register. The most significant bit (MSB) of the register is set to 1, thus the register value is set to around 50% of the full range of the register. Based on the output of the comparator, the MSB is either maintained at 1 or set to 0. For example, if the comparator output is 1, indicating that the register value (converted to analog by the DAC 104) is higher than the input signal $V_{IN}$, the MSB is set to 0. This process is repeated for the next most significant bit (e.g. MSB-1) and successively for each bit in the register until the least significant bit LSB. At this point, the register contains a digital value representing the input signal $V_{IN}$.

One of the main challenges in obtaining a better resolution for a SAR DAC, for example more than 11-12 bit resolution, is mismatch between unit components the DAC, such as mismatch in the capacitors in the DAC. In an example ideal capacitive DAC, each bit of a digital value provided to the DAC is associated with a capacitance that is an integer multiple of a unit capacitance. For example, the LSB may be associated with a capacitance C, the next more significant bit (LSB+1) is associated with a capacitance 2C, the next (LSB+2) with a capacitance 4C, and so on, until the MSB which is associated with a capacitance $2^n$C, where n+1 is the number of bits of the DAC. This arrangement of capacitor sizes is referred to as binary weighting.

However, a DAC may have mismatch between the capacitors, such that the capacitance of a capacitor associated with one or more bits may deviate from the ideal value of an integer multiple of unit capacitance.

Conventional solutions to overcome the mismatch issue include measuring capacitances and trimming each capacitance using smaller capacitors, or digital calibration using a precise ramp input or other well-defined input such as a sine wave. However, each known solution adds considerably to production time and cost and may require each device incorporating a SAR ADC to be connected to equipment to undergo a calibration process.

SUMMARY OF EMBODIMENTS OF THE INVENTION

According to a first aspect of embodiments of the invention, there is provided a method of measuring capacitance error in a successive approximation register (SAR) analog to digital converter (ADC) are described, in which said ADC includes a register and a digital to analog converter (DAC), and the method comprises connecting a first capacitance associated with a first bit of the DAC between a first reference voltage and a second reference voltage, connecting a first set of one or more capacitances associated with one or more other bits of the DAC between the first reference voltage and a third reference voltage, connecting the first capacitance between a first node and the third reference voltage, connecting the first set of one or more capacitances between the first node and the second reference voltage, and measuring a voltage at the first node to determine a representation of a difference between the first capacitance and a total capacitance of the first set of one or more capacitances.

Thus the representation of the difference could be used to measure mismatch error of the first capacitance and/or correct an output of the ADC using the representation. The ADC may include other components such as one or more components of a conventional SAR ADC, and may include a capacitive DAC (also referred to as a switched capacitor DAC).

Other aspects of embodiments include a SAR ADC arranged to carry out methods according to embodiments of the invention, and any device incorporating such an ADC.

BRIEF DESCRIPTION OF THE FIGURES

Embodiments of the invention will now be described by way of example only with reference to the accompanying Figures, in which.

DETAILED DESCRIPTION OF EMBODIMENTS OF THE INVENTION

Embodiments of the invention provide a SAR ADC calibration process that does not require a particular input signal, and does not require connection to particular equipment. At least some calibration processes described herein may be performed "on the fly" with the SAR ADC included within a device and connected to other components.

Figure 1:
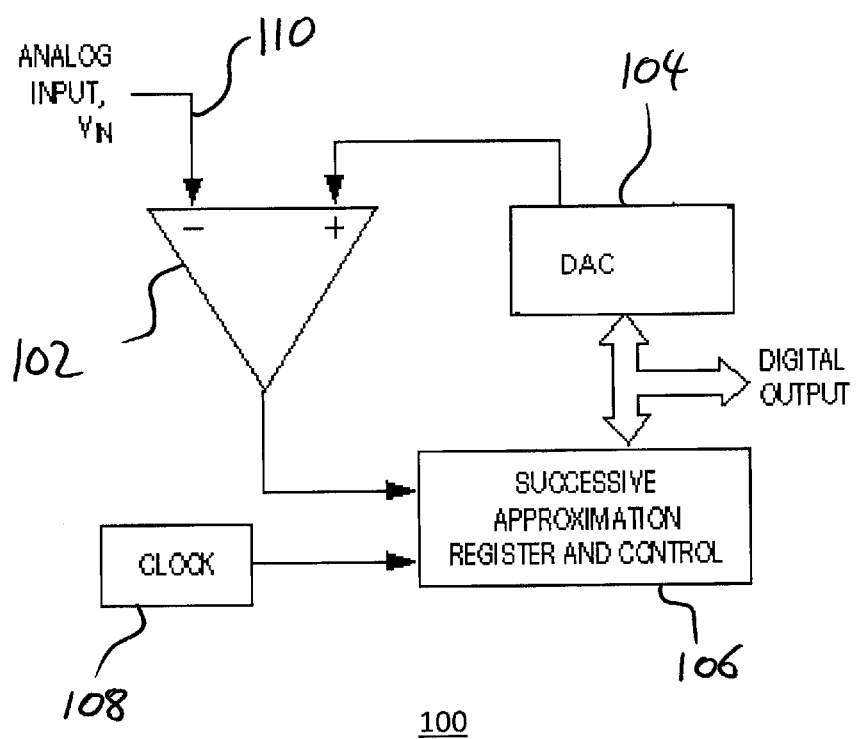
FIG. 1 shows a schematic view of a successive approximation register analog to digital converter (SAR ADC)
Figure 2:
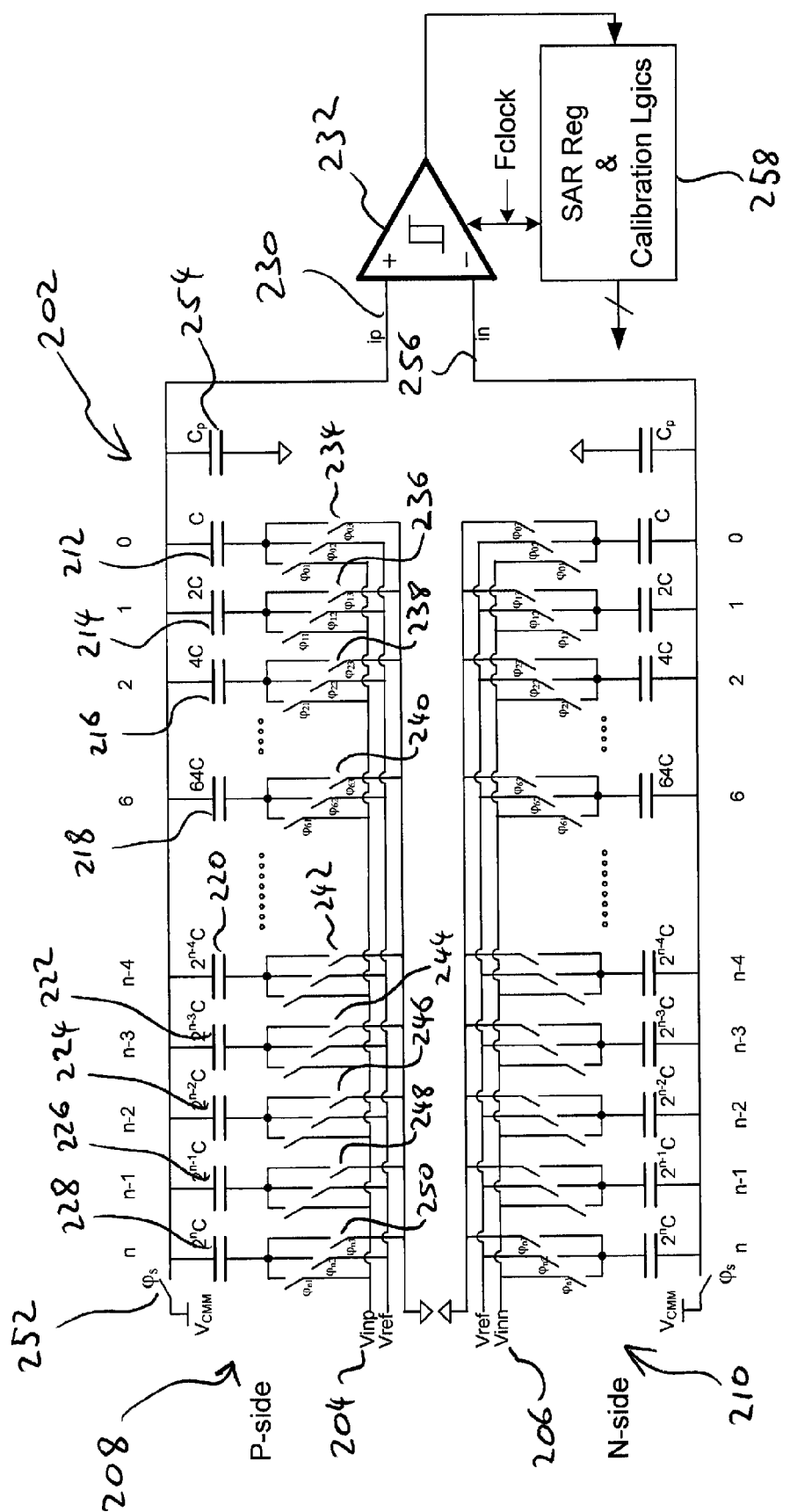
FIG. 2 shows a schematic view of a portion of a SAR ADC.

FIG. 2 shows an example of a differential ADC 200 with capacitive DAC generally indicated as 202. The ADC is a n+1 bit ADC, where the LSB is bit 0 and the MSB is bit n. The ADC receives a differential analog input signal comprising a first signal Vinp 204 and a second signal Vinn 206, with a common mode voltage $V_{CMM}$. The DAC 202 has a p-side 208, associated with Vinp, and an n-side 210, associated with Vinn.

The p-side 208 includes an array of n+1 capacitors 212-228 with values C, 2C, 4C, ..., $2^n$C. Only some of these capacitors are shown in FIG. 2, with dotted lines representing areas where capacitors are not shown for clarity. Each of these capacitors, such as the capacitor 212 of capacitance C associated with the LSB (bit 0), is connected between a node 230 at the positive input of a comparator 232, and a bank of three parallel switches, each bank referred to as 234-250 respectively. The banks of switches can be used to selectively connect each respective capacitor 212-228 between the node 230 and either the input signal Vinp, a voltage Vref, or ground. A further switch 252 selectively connects the node 230 to the common mode voltage $V_{CMM}$. A parasitic capacitance of components in the p-side of the DAC 202 and comparator 232 is represented as capacitance 254 with value $C_p$.

The n-side 210 of the DAC 202 is identical to the p-side 208, including identical components, except that the input signal Vinp is replaced with Vinn in the n-side 210, and the node 230 at the positive input of the comparator 232 is replaced with a node 256 at the negative input of the comparator 232.

A typical operation to convert a differential input signal (Vinp, Vinn) to a digital value using the ADC 200 will now be described. Operation on the p-side 208 will be described, though a similar operation is also performed on the n-side 210 and may be performed simultaneously. The algorithm that is used for successive approximation is not unique and can be different between implementations. This is particularly the case in differential SAR ADCs. Hence the following explanation represents only one example embodiment.

Initially, switch 252 is closed such that node 230 is at the common mode voltage $V_{CMM}$, and the switches 234-250 are controlled such that the capacitors 212-228 are connected to the input signal Vinp. Next, the switch 252 is opened, and the switches 234-250 are controlled such that the capacitors 212-228 are instead connected to ground. This causes the node 230 to move to a voltage $V_{CMM}$-Vinp.

The comparator will compare $V_{CMM}$-Vinp and $V_{CMM}$-Vinn, i.e. the differential input signal (Vinp, Vinn) is compared to 0. In this example, if the output of the comparator is 0, it indicates that the differential input signal to the comparator (Vinp, Vinn)>0. Hence the voltage at the node 230 should be increased. The switches 250 associated with the MSB and the capacitor 228 are controlled to connect the capacitor to the voltage Vref, which is in some embodiments the full-range voltage of the ADC 200. This causes a voltage of approximately Vref/2 to be added to the node 230, such that the voltage is approximately $V_{CMM}$-Vinp+Vref/2. The n-side 210 remains unchanged. Hence the comparator will compare $V_{CMM}$-Vinp+Vref/2 and $V_{CMM}$-Vinn, i.e. the differential input signal (Vinp, Vinn) is compared to +Vref/2.

If alternatively the comparator's output was 1, the p-side is kept unchanged while the MSB capacitor in the n-side (corresponding to the MSB capacitor 228 in the p-side) is connected to Vref. In this case, the differential input signal (Vinp, Vinn) is compared to -Vref/2 at the comparator.

This process is repeated for the next most significant bit (MSB-1), and successively for each remaining bit in the register until the LSB. At this point, the register contains a digital representation of the differential input value (e.g. Vinp-Vinn).

As suggested hereinbefore, mismatch between capacitances of the capacitors in the DAC 202 can lead to errors in the digital output value. Therefore, this application proposes calibration processes that determine errors in capacitances and may also be used to reduce or eliminate errors due to capacitance mismatch.

According to some embodiments, a SAR ADC such as that shown in FIG. 2 may enter a calibration mode whereby an error in capacitance of a capacitor associated with one or more bits of the ADC can be measured. The measured error could be used to reduce the error due to mismatch in subsequent digital output values from the ADC.

In a first phase of a calibration process, the offset of the comparator 232 can be measured, though in other embodiments, measuring the offset can be omitted (in these cases, for example, the offset can be assumed to be zero or a predetermined value, or can be measured in a separate process).

Figure 3:
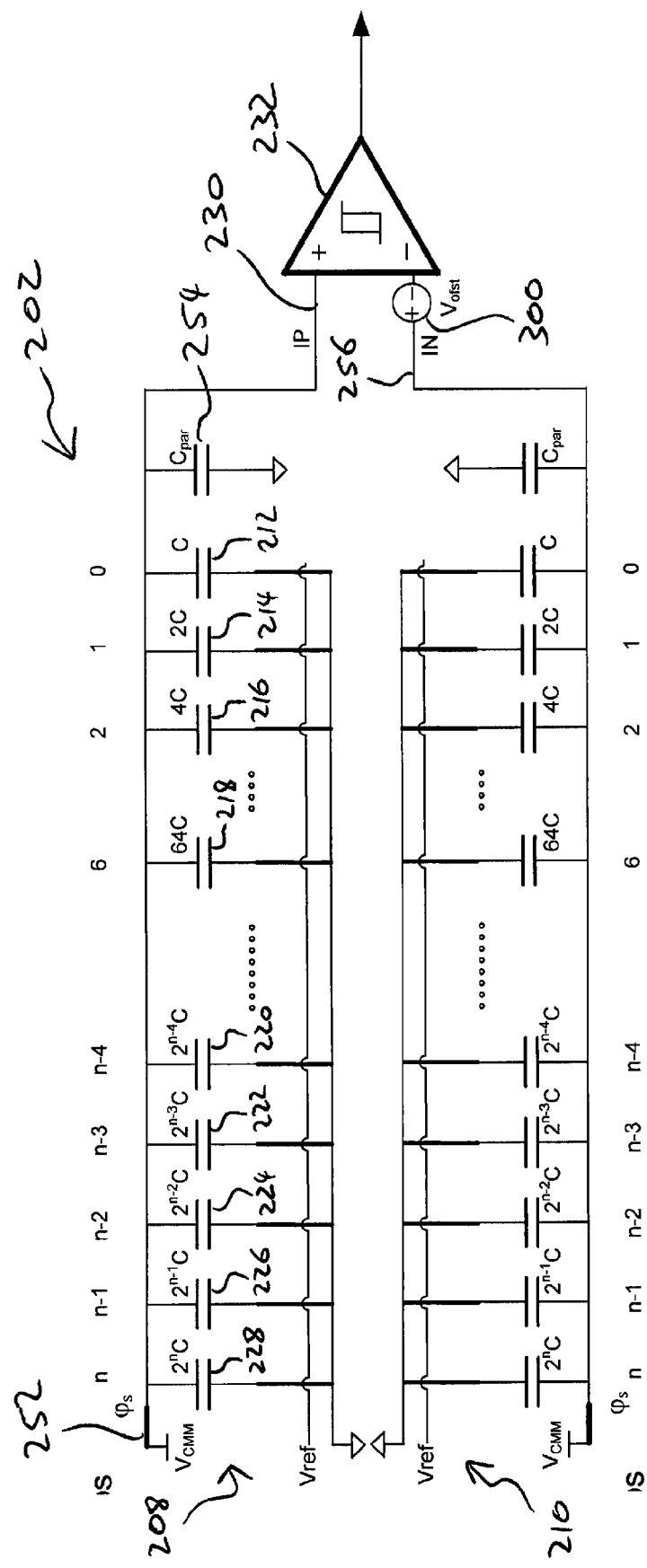
FIG. 3 shows a schematic view of an arrangement of the SAR ADC of FIG. 2.

FIG. 3 shows an example of the ADC 200 of FIG. 2 in a configuration suitable for measuring the offset of the comparator 232. The offset is represented as a voltage source 300 between the node 256 and the negative input of the comparator 232. In the configuration shown, the switches 234-250 and 252 are controlled such that all of the capacitors 212-228 are connected between the common mode voltage $V_{CMM}$ and ground. The offset $V_{ofst}$ is then measured using the ADC 200. That is, the same process for converting a differential analog input signal to digital described above is used, except that the input signal is assumed to be zero, and the capacitors are connected to ground instead of Vinp or Vref during the process. In addition it is possible that only a few LSBs of the ADC 200 are used for the conversion. The offset/capacitive mismatch is assumed in some embodiments to be much smaller than the full range of the ADC 200 and hence only a certain number of LSBs need to be determined. For example, a 12 bit ADC with reference Vref at 1.8V may have a comparator with an offset within +/-5 mV. In this case, only the lower five bits of the register need to be determined, with the more significant bits assumed to be zero. Therefore, the conversion process can start not at the MSB, but at bit LSB+4, followed by bit LSB+3 and so on until the LSB. Hence, the LSB+5, LSB+6, ..., MSB capacitors may be kept grounded in the conversion process. As a result, a digital representation of the offset voltage $V_{ofst}$ is determined in the register.

In a second phase of a calibration process, the capacitance mismatch error of a bit is determined. Not all of the bits need to be determined, such that in some embodiments only a certain number of MSBs are tested, though in other embodiments, other bits may be tested, such as all of the bits, only a selected one of the bits, or a selection of any of the bits.

It is assumed that a certain number of LSBs have an associated capacitance that is accurate enough and hence they can be used to measure the offset and mismatch errors. Mismatch is more critical in MSBs units as they should be matched to within a fraction of the LSB. For example, a unit capacitance C may have a σ mismatch, i.e. $C=C_0(1+\sigma)$, where $C_0$ is the ideal unit capacitance without mismatch. Considering the MSB for example, by calculating the ratio of the MSB capacitance to the rest of the capacitance in the p- or n-side of the DAC it can be calculated that in order to have 0.5 LSB error or less in the DAC due to mismatch, $\sigma < \frac{1}{2}^{n/2}$ should be met, where n+1 is the number of bits of the DAC. For MSB-1, σ is more relaxed as $\sigma < \frac{1}{2}^{(n-1)/2}$ and so on. For the LSB capacitance $\sigma < \frac{1}{2}$ should be satisfied, and this and the requirements for a certain number of other LSBs is much more relaxed than the requirements for the MSBs and can be assumed to be met. The number of LSBs assumed to be adequately matched can vary depending on a number of factors including desired accuracy of the ADC, expected process variations, size of the unit capacitor and so on.

Figure 4:
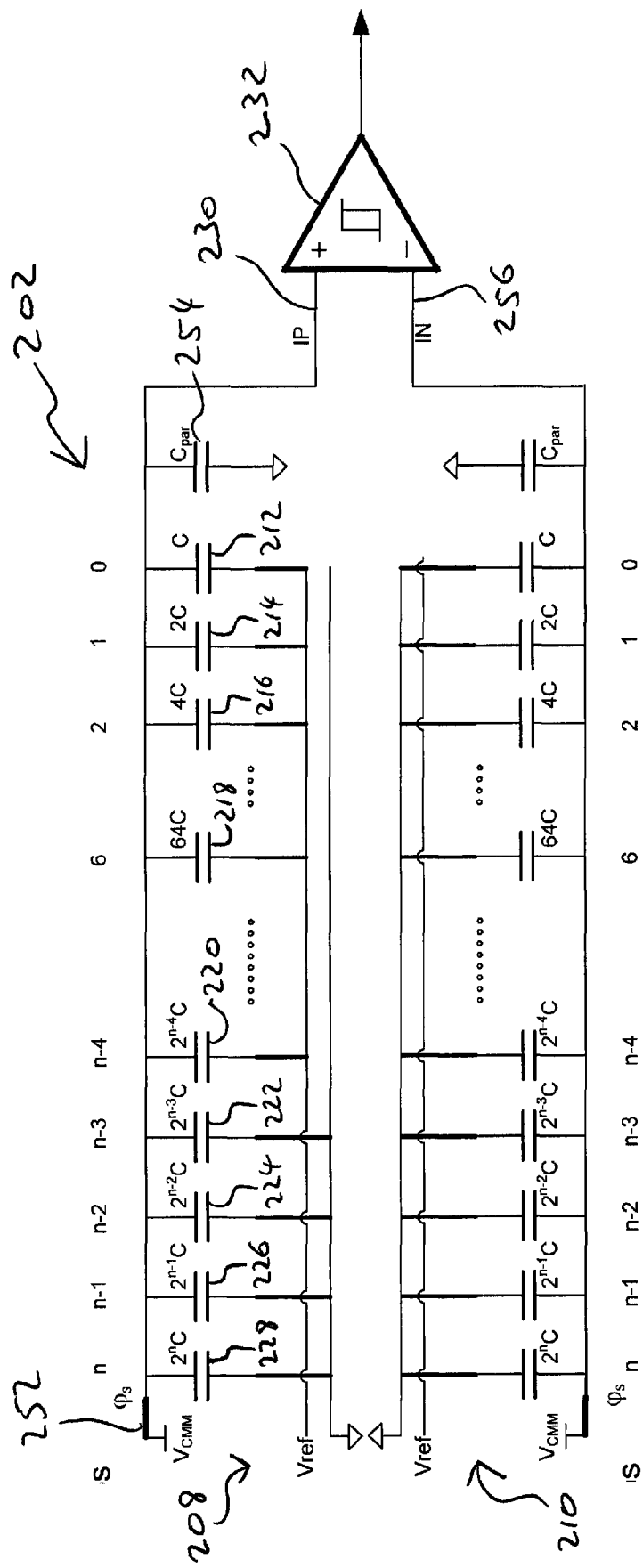
FIG. 4 shows a schematic view of another arrangement of the SAR ADC of FIG. 2.

Of the bits to be tested to determine capacitance mismatch error, in some embodiments, the least significant of these bits is tested first. FIG. 4 shows an example of the DAC 200 of FIG. 2 where the bit MSB-3 is to be tested, though in other embodiments any of the bits may be tested. In this example, it is assumed that bits MSB-4 to LSB are adequately matched (or the error is already known) and so do not need to be tested. In a first step of this phase, shown in FIG. 4, in the p-side, all of the switches 234-250 are controlled such that the capacitances 222-228 associated with all of the MSBs up to and including the bit being tested are connected between the node 230 and ground, and the capacitances 212-220 of the bits lower than the bit being tested are connected between the node 230 and Vref. In addition, the switch 252 is controlled to connect the node 230 to $V_{CMM}$. On the n-side, the corresponding switches are controlled to connect all of the capacitances associated with all of the bits between the node 256 (also connected to $V_{CMM}$) and ground. As a result, the capacitances associated with bits MSB-4 to LSB sample the voltage Vref.

Figure 5:
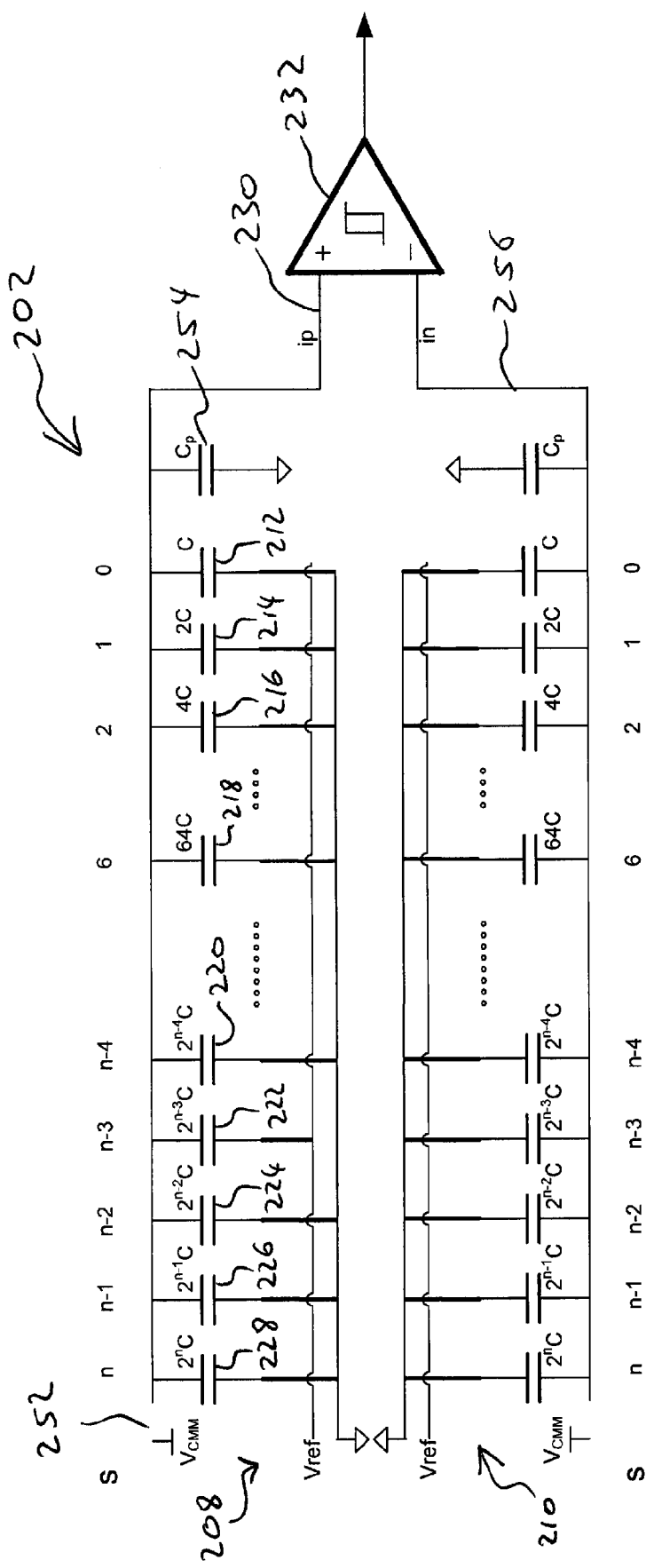
FIG. 5 shows a schematic view of a further of the SAR ADC of FIG. 2.

In a second step of testing the bit MSB-3, shown in FIG. 5, the MSB-3 capacitance 222 is subtracted from the capacitances 212-220 of all of the lower significant bits, MSB-4 to LSB. This is done as shown in FIG. 5 by opening switch 252 between node 230 and $V_{CMM}$ and the corresponding switch on the n-side 210, and by controlling switches such that the MSB-3 capacitance 222 is connected between node 230 and Vref, while the lower capacitances 212-220 are connected between node 230 and ground. As a result, the voltage at node 230, being the voltage $V_{IP}$ at the positive input of the comparator 232, is:

$$V_{IP} = V_{CMM} + V_{ref}\frac{Ce_{n-3}}{C_{tot}} \quad (1)$$

Where $C_{tot}$ is the total capacitance on the p-side, $C_{tot}=C_p+\Sigma_{i=0}^{n}C_i$, where $C_i$ is the capacitance associated with bit i, and $Ce_{n-3}=C_{n-3}-\Sigma_{i=0}^{n-4}C_i$ is the error between the capacitance 222 and the total capacitance of the lower bits, which are in this example bits MSB-4 to LSB.

The voltage $V_{IN}$ at the node 256 and the negative input to the comparator 232 is:

$$V_{IN}=V_{CMM} \quad (2)$$

As a result, the differential voltage presented to the comparator 232 is:

$$V_{IP} - V_{IN} = V_{ref}\frac{Ce_{n-3}}{C_{tot}} \quad (3)$$

In the next step of this phase of determining the error of the capacitance 222 of the bit MSB-3, this voltage in equation (3) above is digitized by a few LSBs of the ADC 200 in a manner similar to that described above to measure the comparator offset voltage $V_{ofst}$. The digital output ($D_{out}$) of the ADC 200 will include the offset voltage $V_{ofst}$. Again, if the error due to the capacitance mismatch and/or the offset voltage is assumed to be within a certain range, only a certain number of LSBs need to be used within the conversion process, with other capacitances remaining in the state as shown in FIG. 5. For example, the five LSBs (LSB+4 to LSB) of the DAC 202 may be used in the conversion process.

The digital output value $D_{out}$ from the ADC 200, which measures the voltage in equation (3), will be:

$$D_{out} = D_{ofst} - \frac{Ce_{n-3}}{C} \quad (4)$$

where C and $D_{ofst}$ are, respectively, unit capacitance and the digital representation of the offset voltage measured previously in the first phase of the calibration process.

Therefore the following representation $EP_{n-3}$ of the capacitance error of the capacitance 222 can be stored in some embodiments:

$$EP_{n-3}=-(D_{out}-D_{ofst})-1 \quad (5)$$

In some embodiments, in the ideal case where all capacitances are perfectly matched, $Ce_{n-3}=C$, and so the −1 term is included in equation (5) to ensure that in the ideal case, $EP_{n-3}=0$.

This second phase shows the first step (FIG. 4) followed by the second step (FIG. 5), though in other embodiments these steps may be performed in either order, which may change the sign associated with some of the measured values but does not otherwise affect the calibration process.

The above second phase is repeated for the corresponding capacitance associated with bit MSB-3 in the n-side 210. As a result, the following representation $EN_{n-3}$ of the capacitance error can be stored:

$$EN_{n-3}=+(D_{out}-D_{ofst})-1 \quad (6)$$

It is noted that the value of $D_{out}$ may be different in equations (5) and (6). The representations shown in equations (5) and (6) are merely examples, and in other embodiments any other suitable representations may be used that allow errors due to capacitance mismatch to be reduced or eliminated from the output of the ADC 200.

As a result of the above process, a representation of the capacitance mismatch errors for the bit MSB-3 are determined and stored. These representations may be used during normal operation of the ADC 200 to correct the output of the ADC 200. The representations may be stored in some embodiments for example in the register and control logic 258 (shown in FIG. 2) and used by the register and control logic 258 in normal operation to correct the output of the ADC 200, though in other embodiments the representations may be stored elsewhere and/or may be used by other components to correct the output of the ADC 200.

The second phase may be repeated for other bits in the DAC 202 of the ADC 200. In some embodiments, errors in capacitances of bits that are more significant than the first tested bit can be determined, and errors due to lower significant bit capacitances can be cancelled from these to improve accuracy. For example, the above process described testing the MSB-3 bit capacitances to obtain $EP_{n-3}$ and $EN_{n-3}$, representing capacitance errors in the capacitances associated with bit MSB-3 on the p-side 208 and n-side 210 respectively. However, in some embodiments the next more significant bit (in this example, bit MSB-2) can be tested to determine the appropriate capacitance errors using the same process described above, but testing capacitance 224 on the p-side 208 and the corresponding capacitance on the n-side. As a result the following representations of capacitance errors for capacitances associated with bit MSB-2 can be stored:

$$EP_{n-2}=-(D_{out}-D_{ofst})-1+EP_{n-3} \quad (7)$$

$$EN_{n-2}=+(D_{out}-D_{ofst})-1+EN_{n-3} \quad (8)$$

As shown, the representations of the errors for bit MSB-2 take into account the errors for bit MSB-3 for a more accurate representation.

Similarly, the second phase of the process may again be repeated for bits MSB-1 and MSB to obtain the following:

$$EP_{n-1} = -(D_{out} - D_{ofst}) - 1 + EP_{n-3} + EP_{n-2} \quad (9)$$

$$EN_{n-1} = +(D_{out} - D_{ofst}) - 1 + EN_{n-3} + EN_{n-2} \quad (10)$$

$$EP_n = -(D_{out} - D_{ofst}) - 1 + EP_{n-3} + EP_{n-2} + EP_{n-1} \quad (11)$$

$$EN_n = +(D_{out} - D_{ofst}) - 1 + EN_{n-3} + EN_{n-2} + EN_{n-1} \quad (12)$$

Thus representations of capacitance errors for all bits from MSB to MSB-3 are determined and can be used to improve the accuracy of ADC 200 output during normal operation.

The above-described example starts from bit MSB-3 and progressively tests more subsequent bits in order until the MSB. However, in other embodiments, more bits may be tested, or only one, or any bits (which are not necessarily adjacent) in any order. However, in some embodiments it may be preferred to test lower significant bits before higher significant bits to ensure that the representations of capacitance errors for higher significant bits can be made more accurate by taking into account errors for lower significant bits.

An advantage of calibration methods described herein is the use of the ADC itself to measure errors, particularly using LSBs of the ADC to measure errors in capacitances associated with more significant bits. As a result, in some embodiments the measured errors are not sensitive to gain errors or parasitic capacitances.

As indicated above, the representations of errors can be used to correct the ADC 200 output during normal operation. This can be done either to the final output of the ADC or during the SAR conversion process. In some embodiments, for example, bits that are "high" (e.g. with a value 1) in the conversion process, with their corresponding capacitances left connected for example between the comparator input and Vref, instead of between the comparator input and ground, are corrected using their corresponding representations of capacitance errors. Correction may not be done for the capacitances associated with "low" bits (e.g. with a value 0) that are left connected between the comparator input and ground as a result of the analog to digital conversion process.

The above examples describe embodiments using a fully differential ADC and DAC. However, in other embodiments, the calibration processes described above can be applied instead to single-ended implementations.

The above-described examples of the second phase of the calibration process describe connecting the capacitance for a bit being tested to ground followed by Vref, and the capacitances for all of the less significant bits to Vref followed by ground. This could be done in an opposite manner, for example by connecting the capacitance being tested to Vref followed by ground, and the lower capacitances to ground followed by Vref. However, in other embodiments, any of the other capacitances could be used in the process, not only the set that includes all of the lower significant bits. For example, any one or more of any of the other capacitances associated with any of the other bits could be used, with the appropriate adjustment to the measured error (for example the appropriate scaling depending on which other capacitances are used), with the capacitances not being used left connected for example to ground. The other capacitances being used are assumed to be well matched or the capacitance mismatch errors have already been measured and can be used to adjust the measured capacitance error of the bit being tested accordingly.

The calibration process can be executed at any point. For example, the calibration process can be executed at the point of production of the analog to digital converter, and stored within a device incorporating the ADC. The calibration process may additionally or alternatively be executed at a later time, including for example when the ADC and any device in which the ADC is incorporated are in use.

Once the calibration has been performed, and errors or representations of errors have been determined for one or more capacitances of the DAC in the ADC, the representations can be used to correct the ADC output such that its output is more accurate. This can be done in a number of ways that are evident to the skilled person. For example, the representations can be used to control trimming capacitances to correct the capacitances associated with a one or more bits in the DAC, or alternatively the representations could be used as information for correcting the output of the ADC directly, either during or after conversion. These are merely examples and other ways for correcting the output are envisaged.

Similar types of correction could also be used during the calibration process. For example, if capacitance error is measured for a capacitance, trimming capacitances could be used during the calibration process to correct capacitance associated with a bit before a most significant bit is tested. In such cases, it may not be necessary to include errors associated with less significant bits when determining a representation of an error for a bit, in contrast to one or more of equations 7-12 above for example.

Although methods, devices and electronic components have been disclosed in the context of certain preferred embodiments and examples, it will be understood by those skilled in the art that this disclosure extends beyond the specifically disclosed embodiments to other alternative embodiments and/or uses and obvious modifications and equivalents thereof. In addition, while several variations have been shown and described in detail, other modifications, which are within the scope of this disclosure, will be readily apparent to those of skill in the art. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the disclosed embodiments. Thus, it is intended that the scope of the present invention herein disclosed should not be limited by the particular disclosed embodiments described above, but should be determined only by a fair reading of the claims that follow.

What is claimed is:

1. A method of measuring capacitance error in a successive approximation register (SAR) analog to digital converter (ADC), said ADC including a register and a digital to analog converter (DAC), the method comprising:

connecting a first capacitance associated with a first bit of the DAC between a first reference voltage and a second reference voltage;

connecting a first set of one or more capacitances associated with one or more other bits of the DAC between the first reference voltage and a third reference voltage;

connecting the first capacitance between a first node and the third reference voltage;

connecting the first set of one or more capacitances between the first node and the second reference voltage; and measuring a voltage at the first node to determine a representation of a difference between the first capacitance and a total capacitance of the first set of one or more capacitances;

the first reference voltage being a common mode voltage, the second reference voltage being one of a predetermined reference voltage and ground, and the third reference voltage being the other of the predetermined reference voltage and ground.

2. The method of claim 1, wherein the one or more bits associated with the first set of one or more capacitances are less significant than the first bit.

3. The method of claim 1, comprising connecting capacitances of the DAC associated with bits other than the first bit and the one or more other bits between the first reference voltage and one of the second and third reference voltages when the first capacitance is connected between the first reference voltage and the second reference voltage, and between the first node and the one of the second and third reference voltages when the first capacitance is connected between the first node and the third reference voltage.

4. The method of claim 1, wherein measuring the voltage at the first node comprises connecting the first node to a first input of a comparator of the ADC, and operating the ADC to measure the voltage at the first node.

5. The method of claim 1, wherein the first node is connected to a first input of a comparator of the ADC, and measuring the voltage at the first node comprises operating the ADC to measure the voltage at the first node.

6. The method of claim 1, wherein the DAC is a differential DAC, and the method further comprises:
connecting a second capacitance associated with the first bit of the DAC between the first reference voltage and the second reference voltage;
connecting a second set of one or more capacitances associated with one or more other bits of the DAC between the first reference voltage and the third reference voltage;
connecting the second capacitance between a second node and the third reference voltage;
connecting the second set of one or more capacitances between the second node and the second reference voltage; and
measuring a voltage at the second node to determine a representation of an error between the second capacitance and a total capacitance of the second set of one or more capacitances.

7. The method of claim 6, wherein at least one of the first node and the second node is connected to a respective input of a comparator of the DAC.

8. The method of claim 1, further comprising:
connecting a further capacitance associated with a second bit of the DAC between the first reference voltage and the second reference voltage;
connecting a further set of one or more capacitances associated with one or more other bits of the DAC between the first reference voltage and a third reference voltage;
connecting the further capacitance between the first node and the third reference voltage;
connecting the further set of one or more capacitances between the first node and the second reference voltage; and
measuring a voltage at the first node to determine a further representation of a difference between the further capacitance and a total capacitance of the further set of one or more capacitances.

9. The method of claim 8, further comprising determining a mismatch error of the further capacitance based on the first representation and the further representation.

10. The method of claim 1, further comprising determining a mismatch error of the first capacitance based on the first representation.

11. The method of claim 1, further comprising using the representation to correct an error in an output of the ADC.

12. The method of claim 1, further comprising:
connecting the first capacitance and the first set of one or more capacitances between the first node and the second or third reference voltage;
connecting the first node to the first reference voltage;
providing a voltage at the first node to a first input of a comparator of the ADC;
providing the first reference voltage to a second input of the ADC; and
using the ADC to measure an offset voltage of the ADC.

13. The method of claim 12, further comprising determining a mismatch error of the first capacitance based on the first representation and the offset voltage.

14. The method of claim 1, comprising carrying out the method for a plurality of bits including the first bit.

15. The method of claim 14, wherein the method is not carried out for one or more least significant bits (LSBs) of the DAC.

16. A successive approximation register (SAR) analog to digital converter (ADC) comprising:
a register; and
a digital to analog converter (DAC), the DAC comprising a plurality of switches and a plurality of capacitors, each of the plurality of capacitors having a capacitance;
wherein the DAC is configured to control the plurality of switches to:
connect a first capacitance associated with a first bit of the DAC between a first reference voltage and a second reference voltage;
connect a first set of one or more capacitances associated with one or more other bits of the DAC between the first reference voltage and a third reference voltage;
connect the first capacitance between a first node and the third reference voltage;
connect the first set of one or more capacitances between the first node and the second reference voltage; and
wherein the DAC is further configured to measure a voltage at the first node to determine a representation of a difference between the first capacitance and a total capacitance of the first set of one or more capacitances;
the first reference voltage being a common mode voltage, the second reference voltage being one of a predetermined reference voltage and ground, and the third reference voltage being the other of the predetermined reference voltage and ground.

17. A device comprising:
a successive approximation register (SAR) analog to digital converter (ADC), wherein the SAR ADC comprises a register; and
a digital to analog converter (DAC), the DAC comprising a plurality of switches and a plurality of capacitors, each of the plurality of capacitors having a capacitance;
wherein the DAC is configured to control the plurality of switches to:
connect a first capacitance associated with a first bit of the DAC between a first reference voltage and a second reference voltage;
connect a first set of one or more capacitances associated with one or more other bits of the DAC between the first reference voltage and a third reference voltage;

connect the first capacitance between a first node and the third reference voltage;

connect the first set of one or more capacitances between the first node and the second reference voltage; and wherein the DAC is further configured to measure a voltage at the first node to determine a representation of a difference between the first capacitance and a total capacitance of the first set of one or more capacitances;

the first reference voltage being a common mode voltage, the second reference voltage being one of a predetermined reference voltage and ground, and the third reference voltage being the other of the predetermined reference voltage and ground.

* * * * *